(12) United States Patent
Yasui et al.

(10) Patent No.: US 11,696,428 B2
(45) Date of Patent: Jul. 4, 2023

(54) MOUNTING SYSTEM

(71) Applicant: FUJI CORPORATION, Chiryu (JP)

(72) Inventors: Yoshihiro Yasui, Nagoya (JP);
Yukihiro Yamashita, Toyohashi (JP)

(73) Assignee: FUJI CORPORATION, Chiryu (JP)

( * ) Notice: Subject to any disclaimer, the term of this patent is extended or adjusted under 35 U.S.C. 154(b) by 0 days.

(21) Appl. No.: 17/417,725

(22) PCT Filed: Dec. 25, 2018

(86) PCT No.: PCT/JP2018/047620
§ 371 (c)(1),
(2) Date: Jun. 23, 2021

(87) PCT Pub. No.: WO2020/136720
PCT Pub. Date: Jul. 2, 2020

(65) Prior Publication Data
US 2022/0015277 A1    Jan. 13, 2022

(51) Int. Cl.
*B23P 19/00* (2006.01)
*H05K 13/04* (2006.01)
*H05K 13/02* (2006.01)

(52) U.S. Cl.
CPC ................................. *H05K 13/021* (2013.01)

(58) Field of Classification Search
CPC ....................................................... H05K 13/02
See application file for complete search history.

(56) References Cited

U.S. PATENT DOCUMENTS 9,936,619 B2 * 4/2018 Nozawa ............ H05K 13/0417
11,134,594 B2 * 9/2021 Yamanaka ......... H05K 13/0419

2018/0242485 A1    8/2018 Kondo et al.
2019/0313554 A1 * 10/2019 Ao .................. H05K 13/0417
2021/0251113 A1 *  8/2021 Kondo ............. H05K 13/0417

FOREIGN PATENT DOCUMENTS

| JP | 2003-283199 A | 10/2003 |
| JP | WO2014/061072 A1 | 4/2014 |
| JP | 2017-163155 A | 9/2017 |
| WO | WO 2017/033268 A1 | 3/2017 |

OTHER PUBLICATIONS

International Search Report dated Apr. 2, 2019 in PCT/JP2018/047620 filed on Dec. 25, 2018, 2 pages.

* cited by examiner

*Primary Examiner* — Paul D Kim
(74) *Attorney, Agent, or Firm* — Oblon, McClelland, Maier & Neustadt, L.L.P.

(57) ABSTRACT

A mounting system including a component mounter, a storage, and a unit exchange device includes a selection section that selects a combination of the specific component feeding unit and the related component feeding unit from the component feeding unit stored in the storage based on combination information indicating a combination of the characteristic rank of the specific component and a component type of the related component corresponding to the characteristic rank, and storage information including the component type, a position, and the characteristic rank of the specific component of the component feeding unit stored in the storage; and a control section that controls the unit exchange device to take out the combination of the specific component feeding unit and the related component feeding unit from the storage and to convey the combination to the component mounter.

5 Claims, 9 Drawing Sheets

| POSITION INFORMATION | FEEDER INFORMATION | | | BRIGHTNESS RANK INFORMATION |
|---|---|---|---|---|
| | FEEDER ID | COMPONENT TYPE | REMAINING AMOUNT OF COMPONENTS | |
| 001 | C1** | *** | *** | — |
| 002 | B2** | *** | *** | — |
| 003 | J1** | LED1 | *** | A2 |
| 004 | B1** | LED1 | *** | A3 |
| 005 | H1** | *** | *** | — |
| 006 | K6** | RE12 | *** | — |
| 007 | K9** | RE23 | *** | — |
| 008 | K2** | RE22 | *** | — |
| ⋮ | ⋮ | ⋮ | ⋮ | ⋮ |

| COMBINATION | LED | | RESISTOR R1 | RESISTOR R2 |
|---|---|---|---|---|
| | COMPONENT TYPE | BRIGHTNESS RANK | COMPONENT TYPE | COMPONENT TYPE |
| 1 | LED1 | A1 | RE11 | RE21 |
| 2 | LED1 | A2 | RE12 | RE22 |
| 3 | LED1 | A3 | RE13 | RE23 |

MOUNTING SYSTEM

TECHNICAL FIELD

The present specification discloses a mounting system.

BACKGROUND ART

Conventionally, in a mounting system including a component mounter on which cassette-type component feeding units (feeders) for supplying components are detachably mounted, a system using a component feeding unit that supplies light-emitting elements such as LEDs whose component characteristics vary due to manufacturing variations, and a component feeding unit that supplies resistance elements for adjusting the above mentioned characteristics variation, has been proposed (for example, refer to Patent Literature 1). In this system, when a combination of the component feeding unit that supplies the light-emitting elements and the component feeding unit that supplies the resistance elements is mounted on the component mounter by an operator, it is assumed that whether the combination of these component feeding units is possible or not is determined, and the operator is notified.

PATENT LITERATURE

Patent Literature 1: WO2014/061072A1

BRIEF SUMMARY

Technical Problem

In the mounting system described above, since an operator prepares a combination of a component feeding unit that supplies light-emitting elements and a component feeding unit that supplies resistance elements to arrange those feeding units in the component mounter, the operator needs to make efforts to search for each combination target component feeding unit. In addition, when the operator makes a mistake in the combination of the component feeding units, the operator can be notified of the fact that the mistake was made by the determination described above, but since the operator needs to search for and arrange the component feeding units again, the start of mounting may be delayed, which leads to a decrease in the efficiency of mounting work.

The present disclosure has a main object of reducing the load on the operator and suppressing the efficiency of the mounting work from decreasing by eliminating the efforts of the operator to search for the combination of the component feeding units.

Solution to Problem

The present disclosure has taken following means to achieve the main object described above.

A mounting system in the present disclosure includes: a component mounter configured to pick up components supplied from multiple component feeding units and mount the components on a board; a storage configured to store the component feeding unit; and a unit exchange device configured to automatically exchange the component feeding units between the component mounter and the storage. The component feeding unit is provided with a specific component feeding unit that supplies specific components having the same component type and different characteristic ranks for each unit, and a related component feeding unit that supplies related components that are mounted in combination with the specific components. The mounting system further includes: a selection section configured to select a combination of the specific component feeding unit and the related component feeding unit from the component feeding unit stored in the storage based on combination information indicating a combination of a characteristic rank of the specific component and a component type of the related component corresponding to the characteristic rank, and storage information including the component type, and a position and the component feeding unit stored in the storage and the characteristic rank of the specific component; and a control section configured to control the unit exchange device to take out the combination of the specific component feeding unit and the related component feeding unit from the storage and to convey the combination to the component mounter.

In the mounting system in the present disclosure, the unit exchange device is controlled such that the combination of specific component feeding unit and related component feeding unit from the component feeding unit stored in the storage is selected based on the combination information and the storage information, and that the selected specific component feeding unit and the related component feeding unit are taken out from the storage and conveyed to the component mounter. In this way, since the operator does not need to search for the combination of the specific component feeding unit and the related component feeding unit from the storage, the load on the operator can be reduced. In addition, the mistake of combination between the specific component feeding unit and the related component feeding unit can be prevented, and thus, it is possible to suppress the efficiency of mounting work from decreasing.

DESCRIPTION OF EMBODIMENTS

Figure 1:
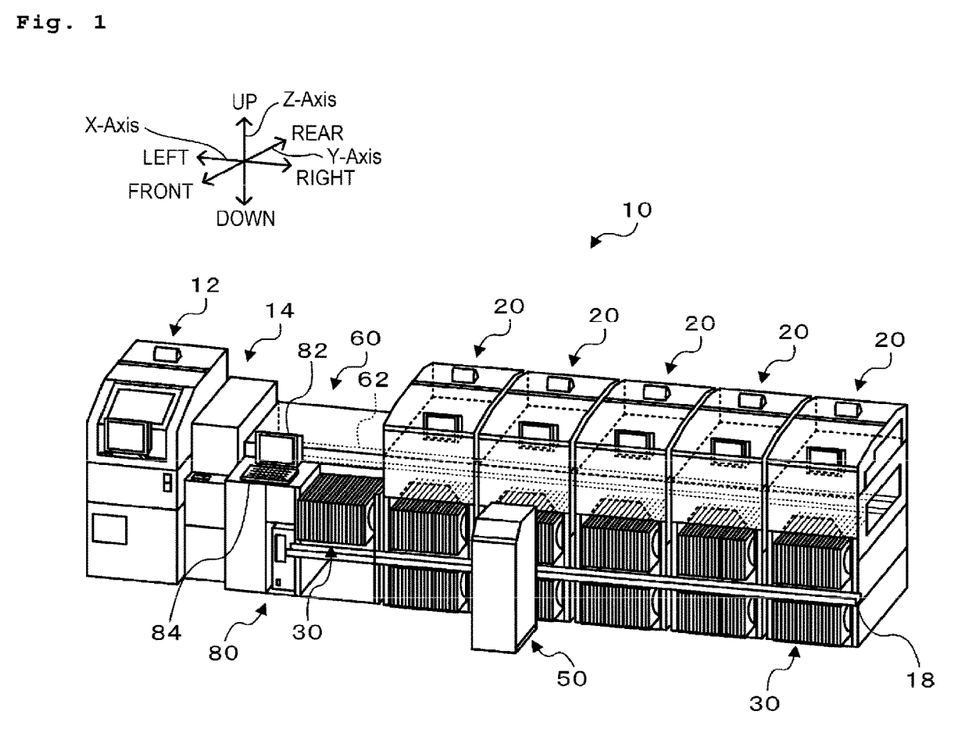
FIG. 1 is a configuration view illustrating an outline of a configuration of component mounting system 10.
Figure 2:
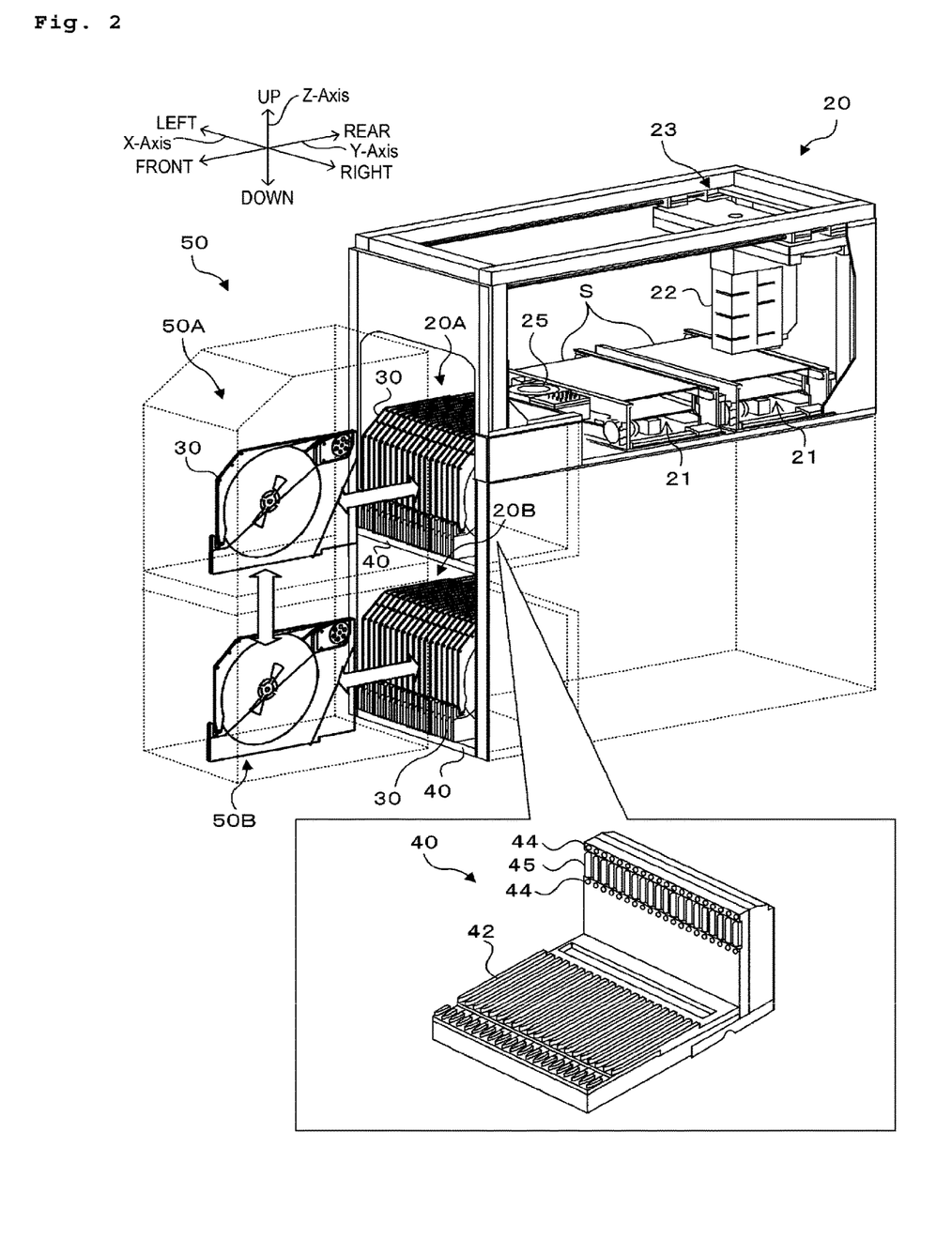
FIG. 2 is a configuration view illustrating an outline of a configuration of component mounter 20.
Figure 3:
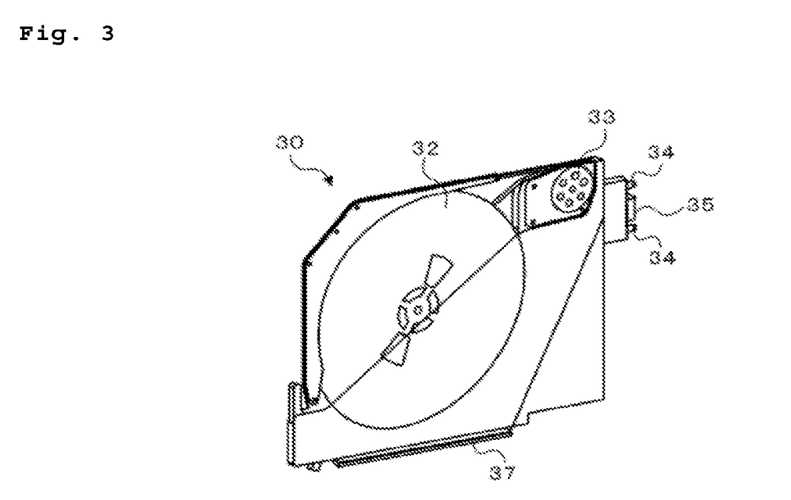
FIG. 3 is a configuration view illustrating an outline of a configuration of feeder 30.
Figure 4:
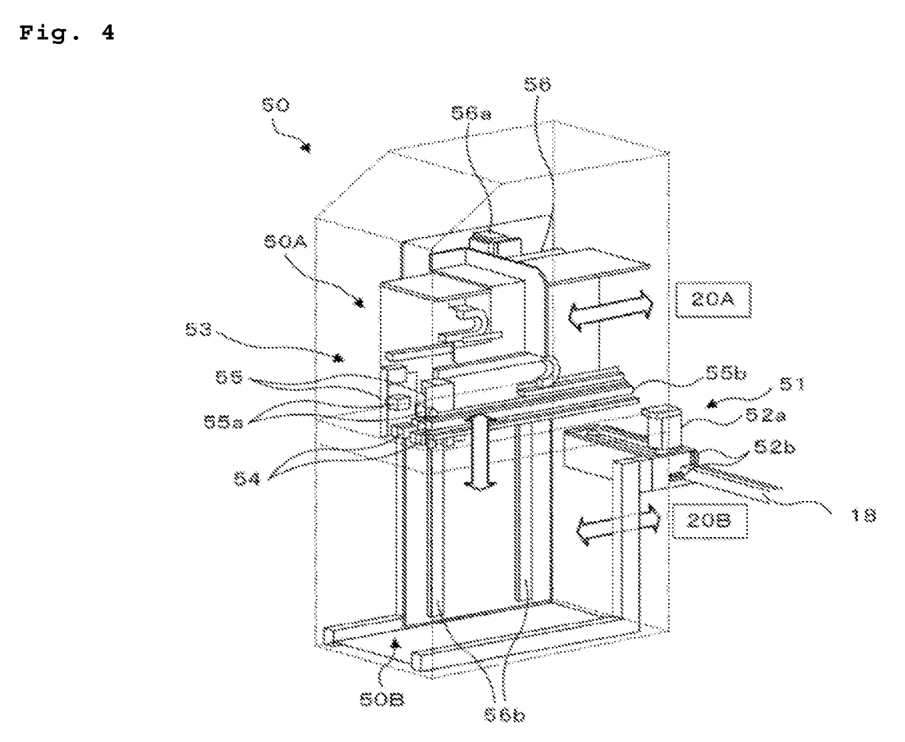
FIG. 4 is a configuration view illustrating an outline of a configuration of loader 50.
Figure 5:
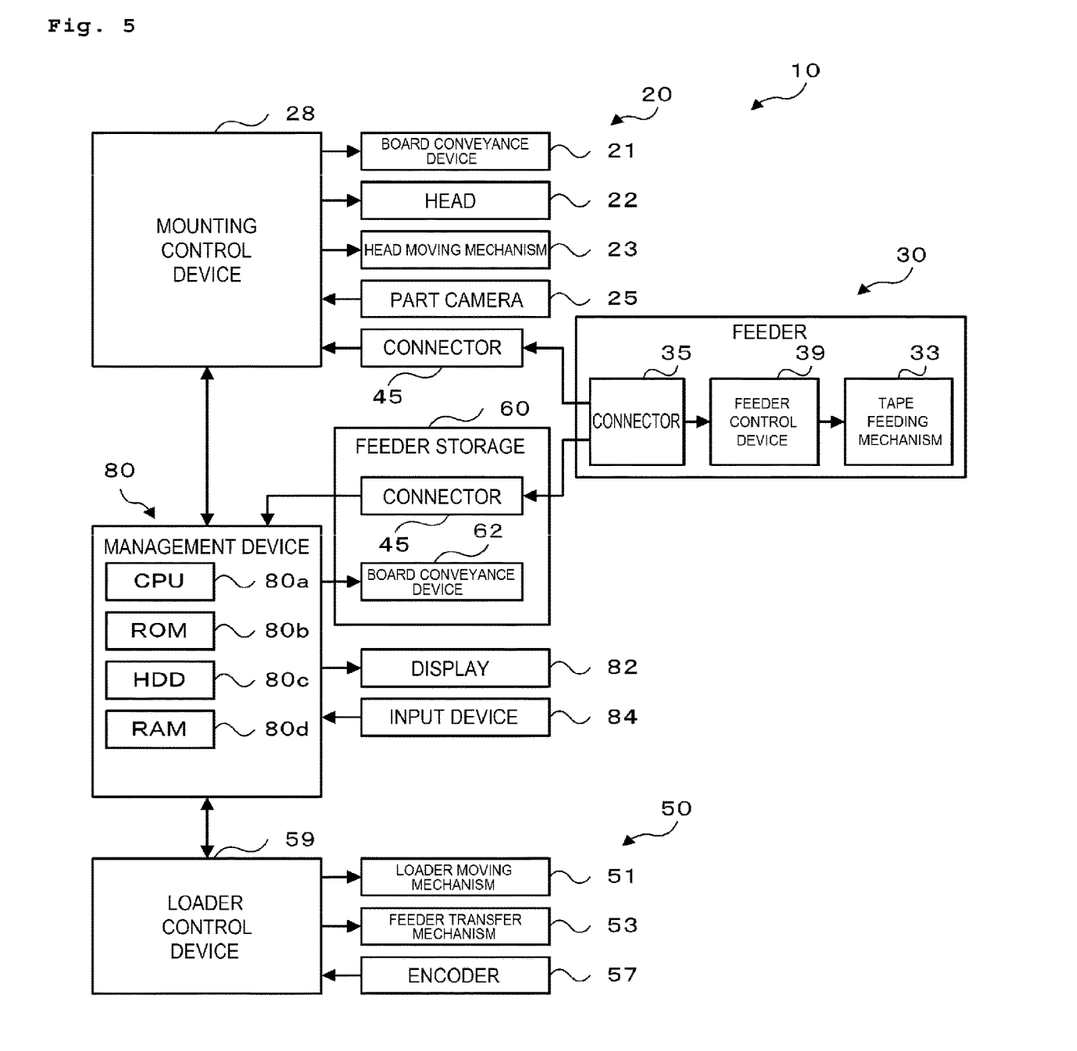
FIG. 5 is a configuration view relating to a control by component mounting system 10.

Next, an embodiment for the present disclosure will be described with reference to the drawings. FIG. 1 is a configuration view illustrating an outline of a configuration of component mounting system 10 in the present embodiment, FIG. 2 is a configuration view illustrating an outline of a configuration of component mounter 20, and FIG. 3 is a configuration view illustrating an outline of a configuration of feeder 30. In addition, FIG. 4 is a configuration view illustrating an outline of a configuration of loader 50, and FIG. 5 is a configuration view relating to a control by component mounting system 10. The left-right direction in FIG. 1 is the X-direction, the front-rear direction is the Y-direction, and the up-down direction is the Z-direction.

As illustrated in FIG. 1, component mounting system 10 includes printer 12, printing inspector 14, multiple component mounters 20, a mounting inspector (not illustrated), loader 50, feeder storage 60, and management device 80 (refer to FIG. 5). Printer 12 prints solder on board S. Printing inspector 14 inspects a state of the solder printed by printer 12. Multiple component mounters 20 are installed side by side along the conveyance direction (X-direction) of board S, and mount the components supplied from feeder 30 on board S. The mounting inspector inspects a mounting state of the components mounted by component mounter 20. Loader 50 replenishes necessary feeder 30 to multiple component mounters 20 and collects used feeder 30 from component mounter 20. Feeder storage 60 stores feeder 30 scheduled to be used by component mounters 20 and used feeders 30. Management device 80 manages the entire system. Printer 12, printing inspector 14, multiple component mounters 20, and the mounting inspector are installed side by side in the conveyance direction of board S in this order and form a production line. Feeder storage 60 is installed between the most upstream component mounter 20 and printing inspector 14 in the production line.

As illustrated in FIG. 2, component mounter 20 includes board conveyance device 21 that conveys board S in the X-direction, head 22 including a suction nozzle for picking up the components, and head moving mechanism 23 that moves head 22 in the XY-directions, and part camera 25 that images the components picked up by the suction nozzle from the below. In addition, component mounter 20 includes mounting control device 28 (refer to FIG. 5) which is configured with well-known CPU, ROM, RAM, and the like, to control the entire device. Mounting control device 28 inputs an image captured by part camera 25, and outputs a drive signal to board conveyance device 21, head 22, head moving mechanism 23, and the like. In addition, component mounter 20 has two upper and lower areas to which feeder 30 can be attached in the front. The upper area is supply area 20A in which the components can be supplied to head 22, and the lower area is buffer area 20B in which the components cannot be supplied but feeder 30 can be stocked. In supply area 20A and buffer area 20B, feeder base 40 to which a predetermined number such as several tens of feeders 30 are arranged and having an L-shaped side view is provided. Feeder base 40 may be configured such that supply area 20A has a larger number of feeders 30 arranged than that in buffer area 20B.

As illustrated in FIG. 3, feeder 30 includes tape reel 32 in which the tape is wound, tape feeding mechanism 33 that sends out the tape from tape reel 32, connector 35 having two positioning pins 34, rail member 37 provided at the lower end, and feeder control device 39 (refer to FIG. 5). In addition, as illustrated in FIG. 2, feeder base 40 includes multiple slots 42 that are arrayed in the X-direction at an interval in which rail member 37 of feeder 30 can be inserted, two positioning holes 44, and connector 45 provided between two positioning holes 44. When rail member 37 of feeder 30 is inserted into slot 42 of feeder base 40, two positioning pins 34 of feeder 30 are inserted into two positioning holes 44, connector 35 and connector 45 are connected to each other. Feeder control device 39 is configured with well-known CPU, ROM, RAM, and the like, and outputs a drive signal to tape feeding mechanism 33. Feeder control device 39 can communicate with a control section (mounting control device 28, management device 80, or the like.) to which feeder 30 is attached via the connections of connectors 35 and 45.

As illustrated in FIG. 1, loader 50 can move along X-axis rail 18 provided parallel to the conveyance direction (X-direction) of the board on the front of multiple component mounters 20 and the front of feeder storage 60. In FIG. 2, the illustration of X-axis rail 18 is omitted. As illustrated in FIGS. 4 and 5, loader 50 includes loader moving mechanism 51, feeder transfer mechanism 53, encoder 57, and loader control device 59. Loader moving mechanism 51 moves loader 50 along X-axis rail 18, and includes X-axis motor 52a such as a servomotor that drives a driving belt and guide roller 52b that guides the movement of loader 50 along X-axis rail 18. Feeder transfer mechanism 53 transfers feeder 30 to component mounter 20 or to feeder storage 60, and includes clamp section 54 that clamps feeder 30 and Y-axis slider 55 that moves clamp sections 54 along Y-axis guide rail 55b in the front-rear direction (Y-direction) by driving Y-axis motor 55a. Feeder transfer mechanism 53 includes two Y-axis sliders 55, and can transfer multiple feeders 30 at the same time by multiple clamp sections 54. Each Y-axis slider 55 can transfer, for example, two feeders 30 at a time. In addition, feeder transfer mechanism 53 includes Z-axis motor 56a that moves slide base 56 to which clamp section 54 and Y-axis slider 55 are slidably attached, in the up-down direction (Z-direction) along Z-axis guide rail 56b. Encoder 57 detects a movement position of loader 50 in the X-direction. Loader control device 59 is configured with a well-known CPU, ROM, RAM, and the like. Loader control device 59 inputs a detection signal from encoder 57, and outputs a drive signal to loader moving mechanism 51 (X-axis motor 52a) and feeder transfer mechanism 53 (clamp section 54, Y-axis motor 55a, and Z-axis motor 56a).

When performing the automatic exchange of feeder 30, first, loader control device 59 controls X-axis motor 52a to move loader 50 to slot 42 of component mounter 20 that performs the automatic exchange. In addition, when performing the automatic exchange between supply area 20A, loader control device 59 moves slide base 56 (Y-axis slider 55) to upper transfer area 50A, and when performing the automatic exchange between buffer area 20B, moves slide base 56 to lower transfer area 50B. Loader control device 59 inserts feeder 30 (rail member 37) into slot 42 by moving Y-axis slider 55 to component mounter 20 side (rearward) in a state where feeder 30 is clamped in clamp section 54, and attaches feeder 30 to feeder base 40 by releasing the clamp. In addition, by moving Y-axis slider 55 forward after moving Y-axis slider 55 to component mounter 20 side and clamping feeder 30 attached to feeder base 40 by clamp section 54, loader control device 59 detaches feeder 30 from feeder base 40 and collects feeder 30 into loader 50.

Feeder storage 60 is provided with feeder base 40 having the same configuration as feeder base 40 of component mounter 20, and can attach and detach feeder 30 by loader 50. In addition, feeder storage 60 is provided with board conveyance device 62 for conveying board S in the X-direction, and can receive board S from printing inspector 14 and delivers board S to the adjacent component mounter 20.

As illustrated in FIG. 5, management device 80 is configured with well-known CPU 80a, ROM 80b, HDD 80c, RAM 80d, and the like, and includes display 82 such as an LCD and input device 84 such as a keyboard and a mouse. Management device 80 stores information on the job (production job) of board S, information on feeders 30, and the like in HDD 80*c*, RAM 80*d*, and the like. In the jobs, which component type will be mounted on board S in what mounting order in each component mounter 20, and how many boards S mounted in this manner will be produced, are specified. In addition, management device 80 is communicably connected to mounting control device 28 and loader control device 59, and each control device of printer 12 and printing inspector 14 by wire or wirelessly. Management device 80 receives information relating to a mounting status of component mounter 20 and information relating to attached and detached feeder 30 from mounting control device 28, and receives information relating to a driving situation of loader 50 from loader control device 59. When the information relating to feeder 30 attached to feeder base 40 of component mounter 20 and feeder 30 removed from feeder base 40 is received from mounting control device 28, management device 80 updates the feeder arrangement information of component mounter 20. In addition, management device 80 outputs a drive signal to board conveyance device 62 of feeder storage 60 and causes board conveyance device 62 to convey board S. In addition, management device 80 is communicably connected to feeder control device 39 of feeder 30 attached to the feeder base of feeder storage 60 via connectors 35 and 45, and when the information relating to feeder 30 attached and detached to and from the feeder base is acquired, management device 80 updates storage information SI in feeder storage 60.

Figure 6:
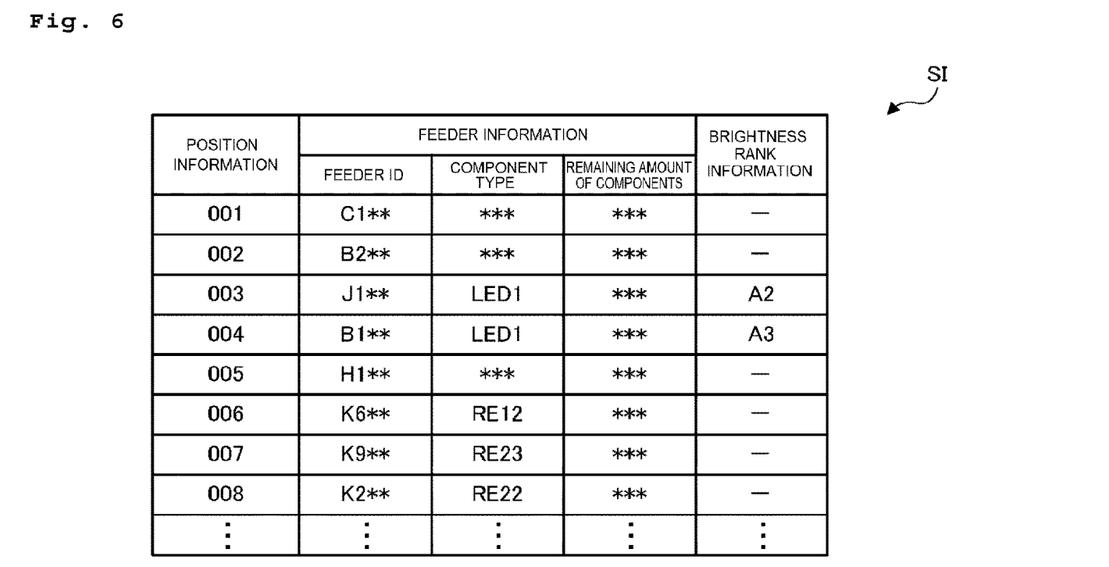
FIG. 6 an explanatory diagram illustrating an example of storage information SI of feeder storage 60.

Here, FIG. 6 is an explanatory diagram illustrating an example of storage information SI of feeder storage 60. The storage information SI includes position information indicating a slot position (number) at which each feeder 30 is arranged (stored) in feeder storage 60, feeder information such as feeder ID (identification information), component type, and remaining amount of the components, brightness rank information and the like. As the brightness rank information, the brightness rank of the LED specified by combination information CI described later is registered. Management device 80 stores storage information SI in a storage section such as HDD 80*c* or RAM 80*d*. In addition, management device 80 stores the arrangement information of feeder 30 including the information same as storage information SI in supply area 20A and buffer area 20B of each component mounter 20, in storage section. Mounting control device 28 stores the arrangement information of feeder 30 in supply area 20A and buffer area 20B of component mounter 20, in the storage section such as RAM.

Figure 7:
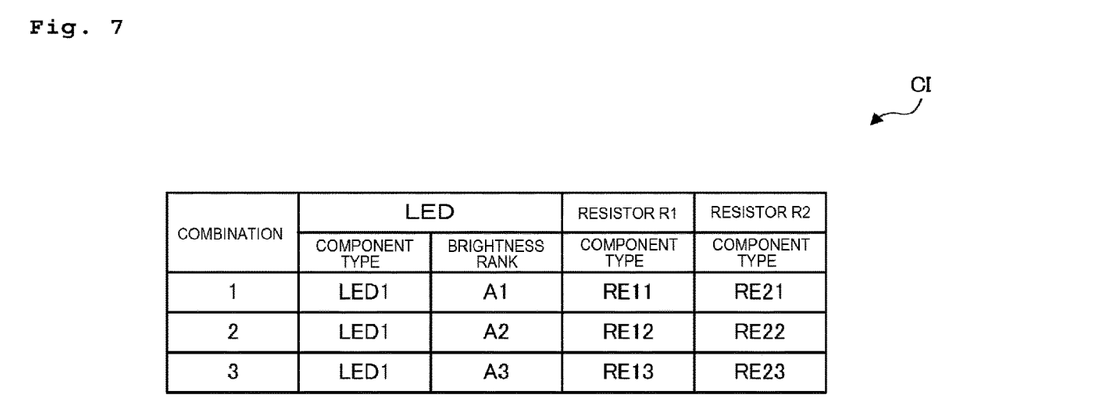
FIG. 7 is an explanatory diagram illustrating an example of combination information CI.

In addition, FIG. 7 is an explanatory diagram illustrating an example of combination information CI. Combination information CI is a list in which the combination of the light-emitting element (here, LED) and the component type of the resistance element (here, resistors R1 and R2) mounted on board S and electrically connected to the LED is specified. These LEDs and resistors R1 and R2 are mounted in combination as a group device, and are also referred to as combination components. LEDs have different brightness ranks for the same component type LED1 due to manufacturing variations, and can be divided into multiple brightness ranks such as brightness A1 to A3. In each feeder unit, the brightness ranks of the LEDs are the same, and LEDs with the same brightness rank are accommodated in one feeder 30 that supplies the LEDs. By mounting the combination of the LEDs and resistors R1 and R2 on board S and adjusting the current supplied to the LED, the LED emits light at a predetermined brightness regardless of the brightness rank. Therefore, the resistance elements such as resistors R1 and R2 need to have different resistance values according to the brightness rank of the LED. As an example of combination information CI, combinations 1 to 3 of the brightness rank of the same component type LED1 and the corresponding component types of resistors R1 and R2 are illustrated in FIG. 7. Management device 80 stores this combination information CI in the storage section such as HDD 80*c* or RAM 80*d*.

Figure 8:
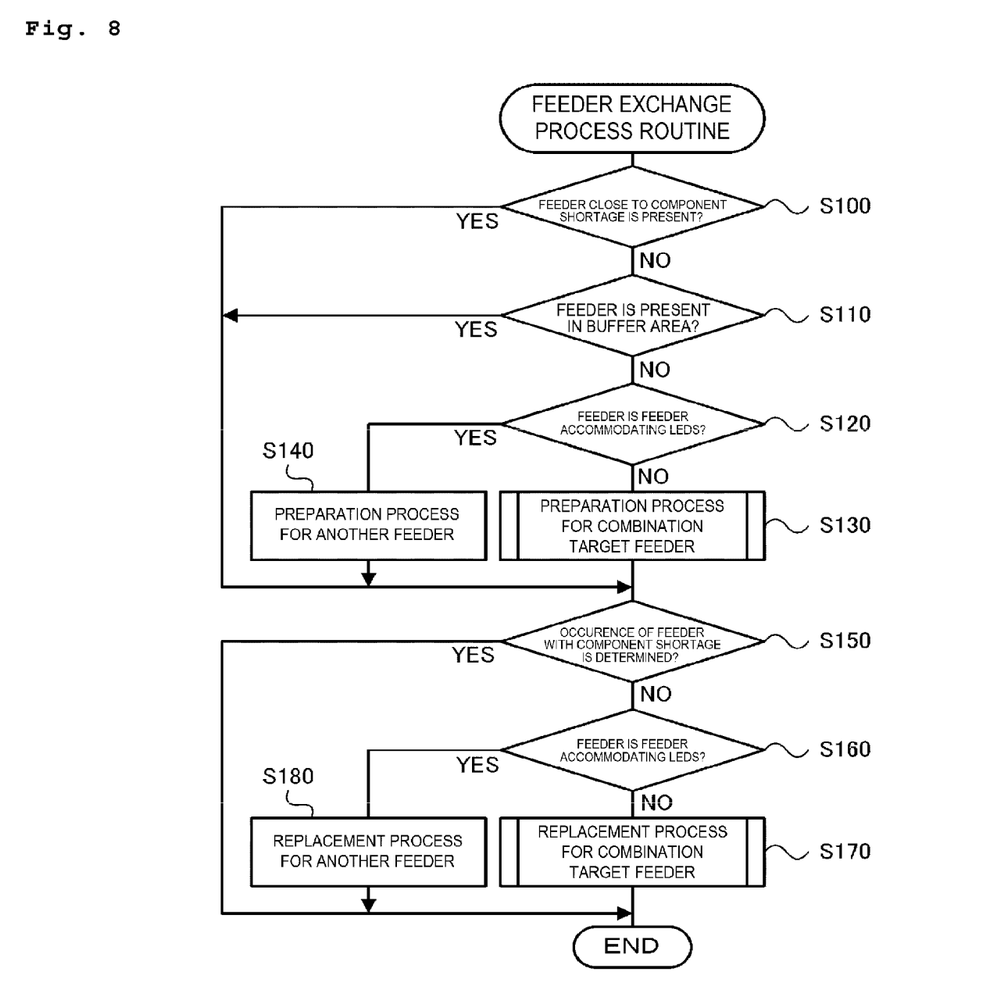
FIG. 8 is a flowchart illustrating an example of a feeder exchange process routine.

Next, the operation in component mounting system 10 configured in this way will be described. FIG. 8 is a flowchart illustrating an example of a feeder exchange process routine. This routine is executed while CPU 80*a* of management device 80 communicates with mounting control device 28 and loader control device 59, for example, when the mounting process is executed by component mounter 20. First, CPU 80*a* determines whether feeder 30 close to a component shortage is present in supply area 20A of component mounter 20 (S100), and when it is determined that feeder 30 close to the component shortage is not present, the process proceeds to S150. When feeders 30 whose remaining amount of components is equal to or less than a predetermined number is present in the feeder arrangement information of supply area 20A, CPU 80*a* determines in S100 that feeder 30 close to the component shortage is present. When it is determined that feeder 30 close to the component shortage is present, CPU 80*a* determines whether feeder 30 accommodating the same component type is not present in buffer area 20B (S110), and when it is determined that feeder 30 accommodating the same component type is present in buffer area 20B, the process proceeds to S150. When it is determined that feeder 30 accommodating the same component type is not present in buffer area 20B, CPU 80*a* further determines whether feeder 30 is feeder 30 accommodating the LEDs or not (S120).

Figure 9:
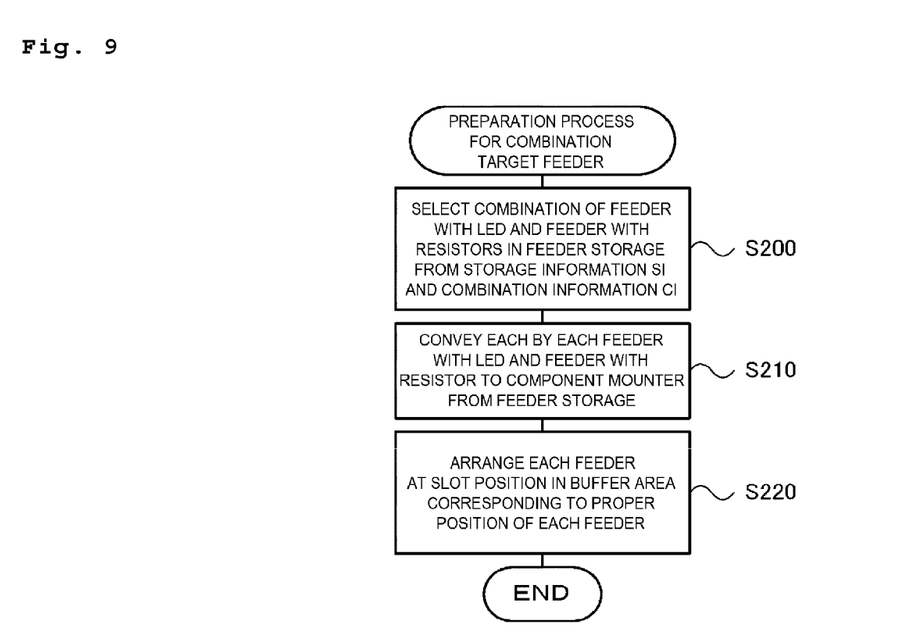
FIG. 9 is a flowchart illustrating an example of a preparation process for combination target feeders.

When it is determined in S120 that feeder 30 is feeder 30 accommodating the LEDs, CPU 80*a* executes the preparation process for the combination target feeder illustrated in FIG. 9 (S130), and the process proceeds to S150. On the other hand, when it is determined in S120 that feeder 30 is not feeder 30 accommodating the LEDs, CPU 80*a* executes a preparation process for another feeder 30 (S140), and the process proceeds to S150. If feeder 30 close to the component shortage is feeder 30 accommodating normal components other than the combination components, or feeder 30 accommodating resistors R1 and R2 among the combination components, the preparation process in S140 is executed. In S140, CPU 80*a* selects new feeder 30 accommodating the component type close to the component shortage with reference to storage information SI. CPU 80*a* causes loader 50 to prepare new feeder 30 by outputting an instruction to loader control device 59 to take out selected feeder 30 from feeder storage 60, to convey selected feeder 30 to component mounter 20, and to arrange selected feeder in buffer area 20B.

Next, CPU 80*a* determines whether feeder 30 with the component shortage occurs in supply area 20A of component mounter 20 (S150), and when it is determined that feeder 30 with the component shortage does not occur, feeder exchange process routine ends. In addition, when it is determined that feeder 30 with the component shortage occurs, CPU 80*a* determines whether feeder 30 is feeder 30 accommodating the LEDs or not (S160).

Figure 10:
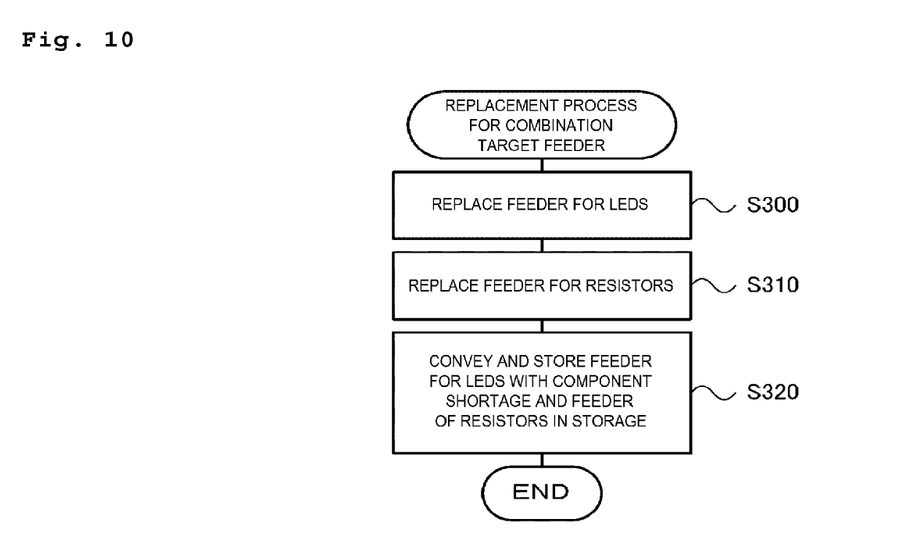
FIG. 10 is a flowchart illustrating an example of replacement process for combination target feeder.

When it is determined in S160 that feeder 30 is feeder 30 for the LEDs, CPU 80*a* executes the replacement process for the combination target feeder illustrated in FIG. 10 (S170), and ends the feeder exchange process routine. On the other hand, when it is determined in S160 that feeder 30 is not feeder 30 for the LEDs, CPU 80a executes the replacement process for another feeder 30 (S180), and ends the feeder exchange process routine. When feeder 30 with the component shortage is feeder 30 for the normal component other than the combination component or feeder 30 for resistors R1 and R2 among the combination components, the replacement process in S180 is executed. In S180, CPU 80a selects new feeder 30 having the component type same as that of feeder 30 with the component shortage with reference to the arrangement information of buffer area 20B. Subsequently, CPU 80a causes loader 50 to replace feeder 30 by outputting an instruction to loader control device 59 to replace feeder 30 with the component shortage with new feeder 30 and to arrange new feeder 30 at a proper position in supply area 20A. With regard to feeder 30 arranged in supply area 20A, a slot position of the arrangement suitable for the mounting process is specified in consideration of a mounting order and pick-up efficiency of the components, and the slot position is referred to as a proper position.

Figure 11A:
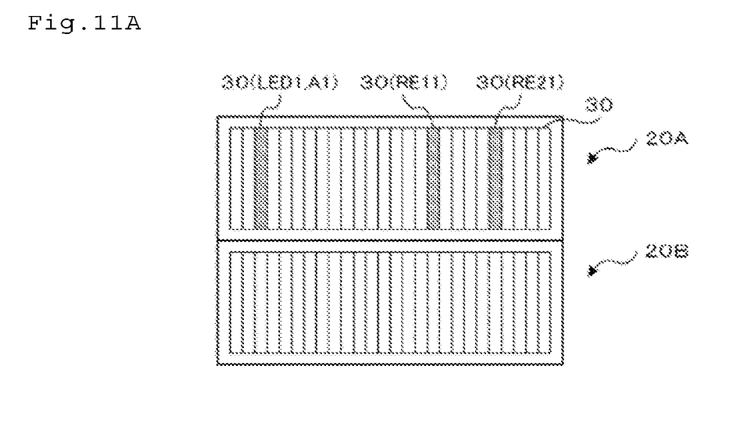
FIG. 11 is an explanatory diagram illustrating an example of an arrangement of feeder 30.

Hereinafter, the preparation process for the combination target feeder in FIG. 9 and the replacement process for the combination target feeder in FIG. 10 will be described. In addition, FIG. 11 is an explanatory diagram illustrating an example of an arrangement of feeder 30. In FIG. 11A, each feeder 30 of combination 1 described above, that is, feeder 30 accommodating component type LED 1 of brightness rank A1, feeder 30 accommodating resistor R1 of component type RE11, and feeder 30 accommodating resistor R2 of component type RE21 are arranged in supply area 20A. In addition, it is assumed that feeder 30 accommodating component type LED1 of brightness rank A1 is a feeder close to the component shortage.

In FIG. 9, CPU 80a selects a combination of feeder 30 accommodating the LED (LED1) and feeder 30 accommodating the resistors (resistors R1 and R2) in feeder storage 60 from storage information SI and combination information CI (S200). For example, in case of storage information SI in FIG. 6, each feeder 30 of combination 2, that is, feeder 30 accommodating component type LED1 of brightness rank A2 arranged at positions 003, 006, and 008, and each feeder 30 accommodating component type RE12 and component type RE22, are selected. When feeder 30 of another combination such as combination 3 is arranged in feeder storage 60, CPU 80a may properly select any one of the combinations. Next, CPU 80a outputs an instruction to loader control device 59 to take out each feeder 30 accommodating the combination component (LED and resistor) from feeder storage 60 and to convey the feeders to component mounter 20 (S210), and causes loader 50 to convey each feeder 30. Then, CPU 80a outputs an instruction to loader control device 59 to arrange each feeder 30 at the slot position in buffer area 20B corresponding to the lower part of the proper position of each feeder 30 (S220), and causes loader 50 to arrange each feeder 30, and then, ends the preparation process for the combination target feeder.

Figure 11B:
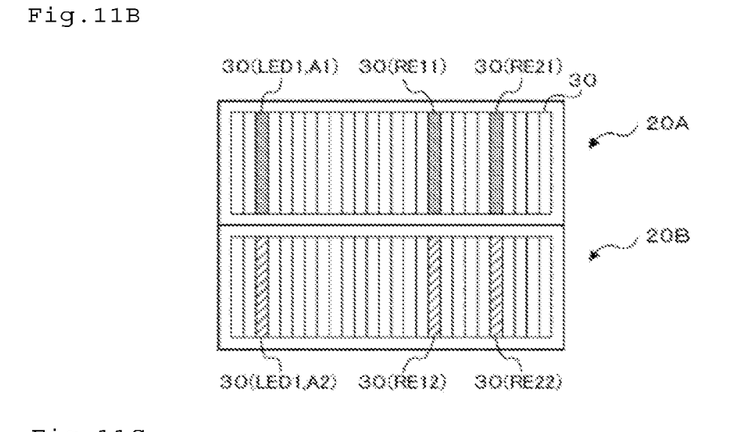

By these processes, each feeder 30 is arranged at the slot position in buffer area 20B corresponding to a position below each proper position in supply area 20A. Therefore, as illustrated in FIG. 11B, feeder 30 accommodating component type LED1 of brightness rank A1 is arranged below feeder 30 accommodating component type LED1 of brightness rank A2, feeder 30 accommodating component type RE12 is arranged below feeder 30 accommodating component type RE11, and feeder 30 accommodating component type RE22 is arranged below feeder 30 accommodating component type RE21.

In addition, in FIG. 10, CPU 80a outputs an instruction to loader control device 59 such that feeder 30 for the LEDs in which the component shortage occurs in supply area 20A, and feeder 30 for the LEDs prepared in buffer area 20B are vertically replaced with other (S300), and causes loader 50 to replace feeders 30 with each other. In addition, CPU 80a outputs an instruction to loader control device 59 such that each feeder 30 for the resistor used in the combination with the LEDs in which the component shortage occurs in supply area 20A and each feeder 30 for the resistors prepared in buffer area 20B are vertically replaced with each other (S310), and causes loader 50 to replace each feeder 30.

Figure 11C:
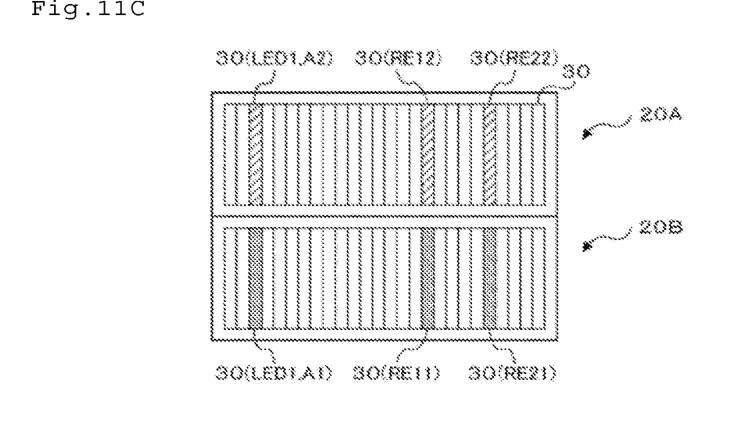

By these processes, as illustrated in FIG. 11C, feeder 30 accommodating component type LED1 of brightness rank A2 of combination 2 and feeders 30 of component types RE12 and RE22 are arranged in supply area 20A. In addition, feeder 30 accommodating component type LED1 of brightness rank A1 in which the component shortage occurs and each feeder 30 accommodating component types RE11 and RE21 are arranged in buffer area 20B. Since each feeder 30 accommodating component type RE11 and RE21 is used in combination with feeder 30 accommodating component type LED1 of brightness rank A1, even if the components remain in feeders 30, feeders 30 are exchanged at the same time. In addition, since each feeder 30 accommodating the LEDs and feeder 30 accommodating the resistors prepared in buffer area 20B is arranged below the proper position, after removing feeder 30 from buffer area 20B, loader 50 can quickly arrange the feeders at the proper position in supply area 20A without moving in the X-direction (left-right direction). The order of S300 and S310 is not limited to this order, and may be the reverse order. Then, CPU 80a outputs an instruction to loader control device 59 to convey and store feeder 30 for the LEDs with the component shortage and feeder 30 for the resistors used in combination with that feeder 30, in feeder storage 60 (S330), causes loader 50 to convey each feeder 30, and ends the replacement process for the combination target feeder.

Here, the correspondence relationships between the configuration elements in the present embodiment and the configuration elements in the present disclosure will be clarified. Feeder 30 in the present embodiment corresponds to the component feeding unit, component mounter 20 corresponds to the component mounter, feeder storage 60 corresponds to a storage, loader 50 corresponds to the unit exchange device, feeder 30 accommodating LEDs corresponds to a specific component feeding unit, feeder 30 accommodating resistors corresponds to the related component feeding unit, storage information SI corresponds to the storage information, and combination information CI corresponds to the combination information. In addition, CPU 80a of management device 80 that executes S200 of the preparation process for the combination target feeder corresponds to a selection section, CPU 80a and loader control device 59 that execute S210 and S220 of the preparation process for the combination target feeder correspond to a control section, and component mounting system 10 corresponds to a component mounting system. Supply area 20A corresponds to a supply available area, and buffer area 20B corresponds to a supply non-available area.

In component mounting system 10 described above, the combination of feeder 30 accommodating the LEDs and feeder 30 accommodating the resistors corresponding to the brightness rank of feeder 30 accommodating the LEDs is selected from feeder storage 60 based on storage information SI and combination information CI. Then, loader 50 is controlled such that selected feeder 30 accommodating the LEDs and feeder 30 accommodating the resistors are taken out from feeder storage 60 and conveyed to component mounter 20 to be arranged. In this way, since it is not necessary for the operator to search for the combination of feeder 30 while referring to storage information SI and combination information CI displayed on display 82 and the like, the load on the operator can be reduced and an arrangement error of the combination of feeder 30 can be prevented, and thus, it is possible to suppress the decrease of the efficiency in the mounting work.

In addition, in component mounting system 10, when the component shortage in feeder 30 accommodating the LEDs is expected, loader 50 is controlled such that the combination of feeder 30 accommodating the LEDs and feeder 30 accommodating the resistors of the same component type is selected and conveyed to component mounter 20 from feeder storage 60 and arranged in buffer area 20B. Therefore, when the component shortage occurs in feeder 30 for the LEDs, since the combination of feeder 30 for the LEDs and feeder 30 for the resistors can be quickly replaced with each other, it is possible to improve the efficiency of mounting work.

In addition, in component mounting system 10, loader 50 is controlled such that feeder 30 accommodating the LEDs is arranged at the slot position in buffer area 20B corresponding to a position below the proper position of feeder 30 accommodating the LEDs in supply area 20A, and feeder 30 accommodating the resistors is arranged at the slot position in buffer area 20B corresponding to a position below the proper position of feeder 30 accommodating the resistors in supply area 20A. Therefore, when replacing the combination of feeder 30 for the LEDs and feeder 30 for the resistor components, loader 50 can suppress the amount of movement of feeder 30 in the arrangement direction, and thus, it is possible to efficiently perform the replacement work.

It is needless to say that the present disclosure is not limited to the above-described embodiments, and can be implemented in various aspects as long as it belongs to the technical scope of the present disclosure.

For example, in the embodiment described above, loader 50 performs the replacement of the combination of feeder 30 for the LEDs and feeder 30 for the resistors between supply area 20A and buffer area 20B, but not limited to this, the replacement may be performed by the operator.

In the embodiment, feeder 30 accommodating the LEDs and feeder 30 accommodating the resistors are arranged at the slot position in buffer area 20B corresponding to each proper position in supply area 20A, but not limited to this, the feeders may be arranged at any slot position in buffer area 20B.

In the embodiment, the preparation process for the combination target feeder in S130 is performed when the component shortage in feeder 30 accommodating the LEDs is expected, but not limited to this, the process only needs to be performed when feeder 30 accommodating the LEDs needs to be newly arranged such as when the component shortage in feeder 30 accommodating the LEDs occurs or when the job is switched. In a case of performing when the component shortage occurs, the combination of feeder 30 accommodating the LEDs and feeder 30 accommodating the resistors may not be arranged in buffer area 20B, but may be automatically exchanged with feeder 30 with the component shortage and be arranged in supply area 20A. In addition, in such a case, component mounter 20 may not have buffer area 20B.

In the embodiment, buffer area 20B is arranged below supply area 20A, but not limited to this, and buffer area 20B may be arranged above supply area 20A. In this case, feeder 30 may be arranged at the slot position in buffer area 20B corresponding to a position above the proper position in supply area 20A.

Figure 12:
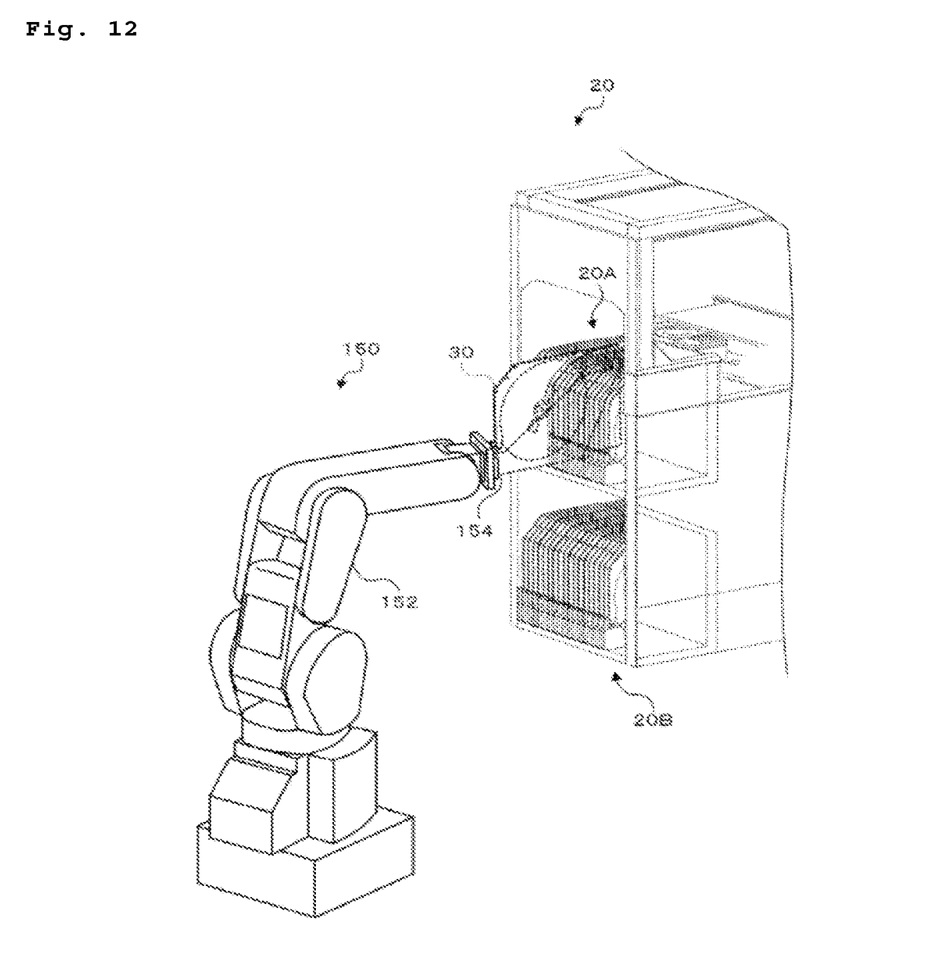
FIG. 12 is an explanatory diagram illustrating an example of exchange robot 150 in a modification example.

In the embodiment, loader 50 moving in the X-direction is exemplified as the unit exchange device; however, the configuration is not limited to this. In the modification example in FIG. 12, feeder 30 is automatically exchanged by exchange robot 150 including vertical articulated robot arm 152 and chuck 154 as an end effector attached to the tip of robot arm 152. In this modification example, although not illustrated, a feeder storage for storing feeder 30 may be arranged so as to face the front of component mounter 20, and exchange robot 150 may be arranged between the feeder storage and component mounter 20. Exchange robot 150 performs the automatic exchange by replacing feeder 30 between the feeder storage and component mounter 20 by replacing the feeders while reversing the direction. Exchange robot 150 and the feeder storage may be provided for every several (for example, 2 to 3) component mounters 20. Alternatively, exchange robot 150 may be configured to be able to travel on a rail installed in the X-axis direction. Not limited to the vertical articulated type, feeder 30 may be automatically exchanged by a horizontal articulated robot, a Cartesian robot, or a parallel link robot, or may be automatically exchanged by automatically conveying feeder 30 by an AGV (automated guided vehicle).

In the embodiment, as an example of a combination of the LED and the resistor, a combination of one LED and two resistors is exemplified, but not limited to this, and a combination of multiple LEDs and multiple resistors may be used. In addition, the LED is exemplified as the light-emitting element, but not limited to this, and other light-emitting elements such as a semiconductor laser or an organic EL may be used. In addition, not limited to the combination of the light-emitting element and the resistance element, a combination of specific components having the same component type and different characteristic ranks and related components mounted in combination with the specific components for adjusting the characteristic rank may be used. Alternatively, if as long as the combination of the specific components and the related components mounted in combination with the specific components is used, not limited to the related components for adjusting the characteristic rank, any components may be used.

Here, the mounting system in the present disclosure may be configured as follows. Here, in the mounting system in the present disclosure, the component mounter may be provided with a supply available area in which the component feeding units can supply the components and a supply non-available area in which the component feeding unit cannot supply the components, the supply available area and the supply non-available area being vertically arranged, the selection section may select a combination of the specific component feeding unit supplying the specific components of the same component type and the related component feeding unit of the related components corresponding to the characteristic rank of the specific component feeding unit, when a component shortage is expected in the specific component feeding unit in the supply available area, and the control section may control the unit exchange device to arrange the combination of the specific component feeding unit and the related component feeding unit in the supply non-available area. In this way, when the component shortage occurs in the specific component feeding unit, since the combination of specific component feeding unit and related component feeding unit can be quickly replaced, it is possible to improve the efficiency of the mounting work.

In the mounting system in the present disclosure, in the component mounter, a proper position suitable for a mounting process may be specified in the supply available area for each component feeding unit, and the control section may control the unit exchange device such that the selected specific component feeding unit is arranged at a position in the supply non-available area corresponding to the proper position of the specific component feeding unit in the supply available area in an up-down direction, and the selected related component feeding unit is arranged at a position in the supply non-available area corresponding to the proper position of the related component feeding unit in the supply available area in the up-down direction. In this way, when the combination of the specific component feeding unit and the related component feeding unit is replaced between the supply available area and the supply non-available area, since the arrangement positions can be replaced with each other in the up-down direction, the replacement work can be performed efficiently.

In the mounting system in the present disclosure, when the component shortage occurs in the specific component feeding unit in the supply available area, the control section may control the unit exchange device such that a combination of the specific component feeding unit with the component shortage and the related component feeding unit arranged in the supply available area and a combination of the specific component feeding unit and the related component feeding unit arranged in the supply non-available area are automatically exchanged. In this way, when the component shortage occurs in the specific component feeding unit, the combination of the specific component feeding unit and the related component feeding unit can be replaced more quickly.

In the mounting system in the present disclosure, the specific component may be a light-emitting element having a different brightness rank as the characteristic rank, and the related component may be a resistance element electrically connected to the light-emitting element. The light-emitting elements have the different brightness rank due to the manufacturing variations and the like, but are required to have the light emitting brightness within a specified brightness when used as products, therefore, the light-emitting element has a great significance to apply the content of the present disclosure.

INDUSTRIAL APPLICABILITY

The present disclosure can be used in the manufacturing industry of component mounting systems and the like.

REFERENCE SIGNS LIST

10 component mounting system, 12 printer, 14 printing inspector, 18 X-axis rail, 20 component mounter, 20A supply area, 20B buffer area, 21 board conveyance device, 22 head, 23 head moving mechanism, 25 part camera, 28 mounting control device, 30 feeder, 32 tape reel, 33 tape feeding mechanism, 34 positioning pin, 35 connector, 37 rail member, 39 feeder control device, 40 feeder base, 42 slots, 44 positioning hole, 45 connector, 50 loader, 50A upper transfer area, 50B lower transfer area, 51 loader moving mechanism, 52a X-axis motor, 52b guide roller, 53 feeder transfer mechanism, 54 clamp section, 55 Y-axis slider, 55a Y-axis motor, 55b Y-axis guide rail, 56 slide base, 56a Z-axis motor, 56b Z-axis guide rail, 57 encoder, 59 loader control device, 60 feeder storage, 62 board conveyance device, 80 management device, 80a CPU, 80b ROM, 80c HDD, 80d RAM, 82 display, 84 input device, 150 exchange robot, 152 robot arm, 154 chuck, CI combination information, S board, SI storage information

The invention claimed is:

1. A mounting system comprising:
a component mounter configured to pick up components supplied from multiple component feeding units and mount the components on a board, the component mounter is including a supply area in which the component feeding units supply the components and a buffer area in which the component feeding units cannot supply the components, the supply area and the buffer area being vertically arranged;
a feeder storage configured to store at least one of the component feeding units;
a loader configured to automatically exchange the component feeding units between the component mounter and the feeder storage, the component feeding units including specific component feeding units that supply specific components having a same component type and different characteristic ranks for each of the specific component feeding units, and include related component feeding units that supply related components that are mounted in combination with each of the specific components;
a selection section configured to select a combination of a first specific component feeding unit of the specific component feeding units and the related component feeding units from the component feeding units stored in the feeder storage based on a combination information indicating a combination corresponding to the characteristic ranks, and a storage information including the component type and a position and the component feeding units stored in the feeder storage and the characteristic ranks of the specific components; and
a control section configured to control the loader to take out the combination of the first specific component feeding unit and the related component feeding units from the feeder storage and to convey the combination to the buffer area.

2. The mounting system according to claim 1,
the selection section selects the combination of the first specific component feeding unit supplying the specific components of the same component type and the related component feeding units supplying the related components, when a component shortage is expected in a second specific component feeding unit in the supply area, and
the control section controls the loader to arrange the combination of the first specific component feeding unit and the related component feeding units in the buffer area directly below the second specific component feeding unit and the related component feeding units.

3. The mounting system according to claim 2,
wherein, in the component mounter, a proper position suitable for a mounting process is specified in the supply area for each of the component feeding units, and
the control section controls the loader such that the specific component feeding units selected by the selection section is arranged at a position in the buffer area corresponding to the proper position of the specific component feeding units in the supply area in an up-down direction, and a selected related component feeding unit is arranged at a position in the buffer area corresponding to the proper position of the related component feeding units in the supply area in the up-down direction.

4. The mounting system according to claim 2,
wherein, when the component shortage occurs in the specific component feeding units in the supply area, the control section controls the loader such that a combination of the specific component feeding units with the component shortage and the related component feeding units arranged in the supply area and a combination of the specific component feeding units and the related component feeding units arranged in the buffer area are automatically exchanged.

5. The mounting system according to claim 1,
wherein the specific components are light-emitting elements having a different brightness rank as the characteristic rank, and the related components are resistance elements electrically connected to the light-emitting elements.

* * * * *